United States Patent
Yano et al.

(10) Patent No.: US 8,129,714 B2
(45) Date of Patent: Mar. 6, 2012

(54) SEMICONDUCTOR, SEMICONDUCTOR DEVICE, COMPLEMENTARY TRANSISTOR CIRCUIT DEVICE

(75) Inventors: Koki Yano, Sodegaura (JP); Hajime Nakanotani, Fukuoka (JP); Chihaya Adachi, Fukuoka (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 573 days.

(21) Appl. No.: 11/806,995

(22) Filed: Jun. 5, 2007

(65) Prior Publication Data
US 2008/0197344 A1 Aug. 21, 2008

(30) Foreign Application Priority Data
Feb. 16, 2007 (JP) ................... 2007-036580

(51) Int. Cl.
*H01L 51/00* (2006.01)
(52) U.S. Cl. ......................................... 257/40
(58) Field of Classification Search ............ 257/40, 257/59–72, E29.273
See application file for complete search history.

(56) References Cited

U.S. PATENT DOCUMENTS

| | | | |
|---|---|---|---|
| 4,556,895 A | 12/1985 | Ohata | |
| 6,284,562 B1 | 9/2001 | Batlogg | |
| 6,429,040 B1 | 8/2002 | Bao | |
| 7,002,176 B2 * | 2/2006 | Iechi et al. | 257/40 |
| 7,064,346 B2 | 6/2006 | Kawasaki et al. | |
| 7,378,683 B2 | 5/2008 | Endoh et al. | |
| 7,453,065 B2 * | 11/2008 | Saito et al. | 250/338.4 |
| 7,671,448 B2 * | 3/2010 | Furukawa et al. | 257/642 |
| 2003/0186059 A1 | 10/2003 | Hirata | |
| 2005/0208400 A1 * | 9/2005 | Nishikawa et al. | 430/57.8 |
| 2006/0113565 A1 | 6/2006 | Abe et al. | |
| 2006/0243965 A1 | 11/2006 | De Leeuw | |
| 2008/0108198 A1 | 5/2008 | Wager, III et al. | |

FOREIGN PATENT DOCUMENTS

| | | |
|---|---|---|
| EP | 1 718 126 A | 11/2006 |
| JP | 58-188165 A2 | 11/1983 |
| JP | 8-228034 A2 | 9/1996 |
| JP | 9-199732 A | 7/1997 |
| JP | 2001-177109 A | 6/2001 |
| JP | 2002-26336 A | 8/2002 |
| JP | 2002-254002 | 3/2004 |
| JP | 2005-026872 | 1/2005 |
| JP | 2005-209455 | 8/2005 |
| JP | 2005-150410 | 9/2005 |

(Continued)

OTHER PUBLICATIONS

Takahashi Jun, Patent Abstract of Japanese Publication No. 2005-026872, published Jan. 27, 2005, pp. 1-2.
Takenobu Hiroshi, Patent Abstract of Japanese Publication No. 2005-150410, published Jun. 9, 2005, pp. 1-2.

(Continued)

*Primary Examiner* — Cuong Q Nguyen
(74) *Attorney, Agent, or Firm* — Millen, White, Zelano & Branigan, P.C.

(57) ABSTRACT

A semiconductor device including a semiconductor 1, a first electrode 2, an insulating layer 3 interposed between the semiconductor 1 and the first electrode 2, the second electrode 4 which is in contact with the semiconductor 1 and is detached from the first electrode 2, and the third electrode 5 which is in contact with the semiconductor 1 and is detached from the first electrode 2 and the second electrode 4, wherein the semiconductor 1 is provided with the organic semiconductor layer 10 and the oxide semiconductor layer 11.

16 Claims, 12 Drawing Sheets

FOREIGN PATENT DOCUMENTS

| | | |
|---|---|---|
| JP | 2006-502597 T2 | 1/2006 |
| JP | 2006-165532 A | 6/2006 |
| JP | 2006-165532 A2 | 6/2006 |
| JP | 2006-581938 A | 8/2006 |

OTHER PUBLICATIONS

J. H. Schoen, Ambipolar Pentacene Filed-Effect Transistors and Inverters, Science, Feb. 11, 2000, 1022-1023, vol. 287.

* cited by examiner

SEMICONDUCTOR, SEMICONDUCTOR DEVICE, COMPLEMENTARY TRANSISTOR CIRCUIT DEVICE

TECHNICAL FIELD

The invention relates to a semiconductor provided with ambipolar characteristics which is used in a thin film transistor (hereinafter abbreviated as "TFT") or the like, a semiconductor device using the semiconductor, and a complementary transistor circuit device using the semiconductor device.

BACKGROUND

In recent years, an organic semiconductor using an organic substance has attracted attention as a semiconductor for a TFT.

Generally, organic substances used in an organic semiconductor have such advantages that not only they can be formed into a thin film by a relatively easy film-forming method such as spin coating and vacuum vapor deposition, but also they can produce a TFT at low temperatures as compared with a conventional TFT which is prepared using amorphous or polycrystalline silicon. Processing at low temperatures enables formation of a film on a plastic substrate having a low heat resistance. As a result, various effects such as a decreased display weight or a reduced cost, as well as diversified applications due to flexibility of the plastic substrate can be expected.

As the organic substance constituting an organic semiconductor, an organic substance with a large carrier mobility, which is used in a TFT or the like, is used. Examples include a single crystal of acene such as anthracene, tetracene, and pentacene. An organic semiconductor formed of such a substance is reported to have a carrier mobility of about 1 (cm$^2$ V$^{-1}$s$^{-1}$).

Using such an organic semiconductor in a TFT encounters a problem that control of the conductivity type of a channel by doping with impurities is difficult as compared with the case where amorphous or polycrystalline silicon is used in a TFT. Therefore, in order to control the conductivity type of a channel in a transistor where a plurality of TFTs are formed on a substrate in a complementary transistor circuit, for example, an organic substance used in the organic semiconductor is selected appropriately, and an n-channel type TFT and a p-channel type TFT are fabricated separately.

However, since the n-channel type TFT and the p-channel type TFT are fabricated separately using different organic substances, such a circuit is difficult to be put into a practical use due to a complicated production process and an increased production cost.

Under such circumstances, study has been made on a semiconductor provided with the so-called ambipolar characteristics capable of transporting both holes and electrons. Unlike the case where only a monopolar semiconductor is used, such an ambipolar semiconductor enables a circuit composed of a plurality of TFTs to act as both an n-channel type TFT and a p-channel type TFT using only a single organic substance. Accordingly, separate patterning of an n-channel type TFT and a p-channel type TFT becomes unnecessary. As a result, production process is simplified and a significantly reduced production cost can be expected.

As for the technology of an ambipolar semiconductor using an organic substance, a single crystal of pentacene with a high degree of purity is known to function as an ambipolar semiconductor (Non-Patent Document 1). An organic semiconductor formed of a single crystal of the above-mentioned other organic substances than pentacene above or an organic semiconductor formed of a single crystal of pentacene with a low degree of purity is monopolar, and functions either p-type (hole transporting) or n-type (electron transporting). In contrast, an organic semiconductor formed of a single crystal of pentacene with a high degree of purity functions both as a p-type semiconductor and an n-type semiconductor.

As examples of the conventional ambipolar semiconductor technology, the following can be given. A voltage control layer formed of a silane compound or the like is stacked on an organic semiconductor layer to allow the semiconductor to exhibit ambipolar characteristics (Patent Document 1). A carbon nanotube is combined with an organic semiconductor to allow the organic semiconductor to exhibit ambipolar characteristics (Patent Document 2). Particles in the form of a thin film obtained by oxidation of carbon black are incorporated in an organic semiconductor to allow the organic semiconductor to exhibit ambipolar characteristics (Patent Document 3). An organic substance with n-type characteristics and an organic substance with p-type characteristics are incorporated in combination in an organic semiconductor to allow the organic semiconductor to exhibit ambipolar characteristics (Patent Document 4). A mixture of an organic substance with n-type characteristics and an organic substance with p-type characteristics is used in an organic semiconductor to allow the organic semiconductor to exhibit ambipolar characteristics (Patent Document 5). A semiconductor device prepared using an amorphous oxide and is provided with an n-type region and a p-type region (Patent Document 6).

Technologies of applying a semiconductor device such as a TFT in a CMOS circuit are described in Patent Documents 7 and 8. Patent Documents 4 and 5 describe application of a semiconductor device such as a TFT prepared by using an ambipolar semiconductor is used to a display, a screen, an inverter, or the like.

Patent Document 1: JP-A-2005-26872
Patent Document 2: JP-A-2005-150410
Patent Document 3: JP-A-2004-95790
Patent Document 4: JP-A-2005-209455
Patent Document 5: JP-B-2006-518938
Patent Document 6: JP-A-2006-165532
Patent Document 7: JP-A-2001-177109
Patent Document 8: JP-A-2002-26336
Non-Patent Document: J. H. Schon, et al, Science Vol. 287, 1022 (2000)

In the above-mentioned Non-Patent Document 1, almost no substances other than pentacene are reported as an organic substance which exhibits ambipolar characteristics alone without combining with other substances. Therefore, only a limited material selection is permitted, which may make circuit design or the like difficult. In addition, pentacene exhibits ambipolar characteristics only when it has a high degree of purity. Normal pentacene exhibits only p-type characteristics, which may make production of a semiconductor device difficult and costly.

Therefore, like the technologies described in Patent Documents 4 and 5, an ambipolar semiconductor is fabricated using both an organic substance having n-type characteristics and an organic substance having p-type characteristics in order not to depend on the characteristics of a single substance, and such an ambipolar semiconductor is used in a semiconductor device such as a complementary transistor or a light-emitting element. However, the technologies disclosed in Patent Documents 4 and 5 have such disadvantages that operation of the semiconductor and the semiconductor device using thereof tends to be unstable due to the combined use of an organic substance having n-type characteristics and an organic substance having p-type characteristics.

The invention has been made in view of the above problems, and an object thereof is to provide a semiconductor which can be fabricated at a low cost due to the use of an organic semiconductor, can exhibit ambipolar characteristics, and is capable of being used widely due to stable operation, a semiconductor device using the semiconductor, and a complementary transistor circuit using the semiconductor device.

SUMMARY OF THE INVENTION

In order to attain the object, the semiconductor of the invention is provided with an organic semiconductor layer and an oxide semiconductor layer.

It is preferred that the semiconductor be provided with ambipolar (both n-type and p-type) characteristics.

The organic semiconductor layer is preferably formed of an organic substance with p-type characteristics, an organic substance with ambipolar characteristics, an organic substance with n-type characteristics, or a stacked body or a mixture body composed of two or more of these organic substances.

It is more preferred that the oxide semiconductor layer be composed of an n-type non-degenerated oxide.

A semiconductor with such a configuration is ambipolar and operates stably. Operation becomes more stable if the oxide semiconductor layer is formed of an n-type oxide semiconductor. The application of a semiconductor can be diversified due to the stable operation.

It is preferred that the oxide semiconductor layer have an electron carrier density of less than $10^{18}/cm^3$.

It is preferred that the oxide semiconductive layer be formed on an oxide containing at least any of In, Zn, Sn and Ga. In particular, the oxide semiconductive layer may preferably be formed of any of an amorphous oxide containing In, Ga and Zn, an amorphous oxide containing Sn, Zn and Ga, an amorphous oxide containing In and Zn, an amorphous oxide containing In and Sn, an amorphous oxide containing In and Ga, and an amorphous oxide containing Zn and Sn.

It is preferred that the oxide semiconductor layer be formed of a polycrystalline oxide containing any of In, Zn, Sn, and Ga.

It is preferred that the oxide semiconductor layer be formed of a polycrystalline oxide containing In and a positive divalent element.

It is preferred that the oxide semiconductor layer have a work function of 4.8 (eV) or more.

An oxide semiconductor layer formed of an oxide containing a lanthanide is preferable since it has a high work function.

It is preferred that the oxide semiconductor layer have a band gap of 2.5 (eV) or more.

Preferably, the oxide semiconductor layer is a stacked layer structure in which a plurality of layered oxide are stacked, and a layered oxide closest to the organic semiconductor layer is formed of a material which allows the layered oxide to have a work function larger than the work function of other layered oxides.

It is preferred that the semiconductor have a configuration in which the organic semiconductor layer and the oxide semiconductor layer be in contact with each other.

The above configuration enables the semiconductor to have improved characteristics.

The semiconductor device to attain the above object comprising:
  a semiconductor;
  a first electrode;
  an insulating layer interposed between the semiconductor and the first electrode;
  a second electrode which is in contact with the semiconductor and is detached from the first electrode;
  a third electrode which is in contact with the semiconductor and is detached from the first electrode and the second electrode;
  the semiconductor being formed of the above-mentioned semiconductor.

The semiconductor device exhibits ambipolar characteristics due to the use of the above-mentioned semiconductor as a semiconductor. Further, due to the combination of the organic semiconductor layer and the oxide semiconductor layer, the semiconductor in this semiconductor device can operate stably.

It is preferred that the semiconductor device have a configuration in which the organic semiconductor layer and the oxide semiconductor layer are formed into a thin film.

A ratio ($\mu(n)/\mu(p)$) of the field effect mobility ($\mu(n)$) at the time of n-type driving and the field effect mobility ($\mu(p)$) at the time of p-type driving is within a range of $10^{-5} \leq \mu(n)/\mu(p) \leq 10^5$.

The semiconductor device with such a configuration operates stably due to optimized balance of the field effect mobility at the time of n-type driving and the field effect mobility at the time of p-type driving.

The complementary transistor circuit device of the invention to achieve the above object is a complementary transistor circuit device provided with a plurality of semiconductor devices wherein at least one of the plurality of the semiconductor devices is formed of the above-mentioned semiconductor device.

Due to the use of the above-mentioned ambipolar semiconductor device, the circuit device is free from the need of separated provision of an n-type semiconductor device and a p-type semiconductor device, which leads to a reduced production cost of the entire circuit device.

The semiconductor of the invention contributes a reduction in production cost since formation of the organic semiconductor layer can be facilitated. Further, due to the combination of the organic semiconductor layer and the oxide semiconductor layer, the semiconductor of the invention exhibits ambipolar characteristics and operates stably. Therefore, the semiconductor of the invention can be used more widely.

The semiconductor device of the invention can operate stably due to the use of the above-mentioned semiconductor.

In the complementary transistor circuit device of the invention, separate fabrication of an n-type semiconductor device and a p-type semiconductor device is unnecessary due to the use of the above-mentioned semiconductor device, leading to a reduction in production cost of the entire circuit device.

BEST MODE FOR CARRYING OUT THE INVENTION

Figure 1A:
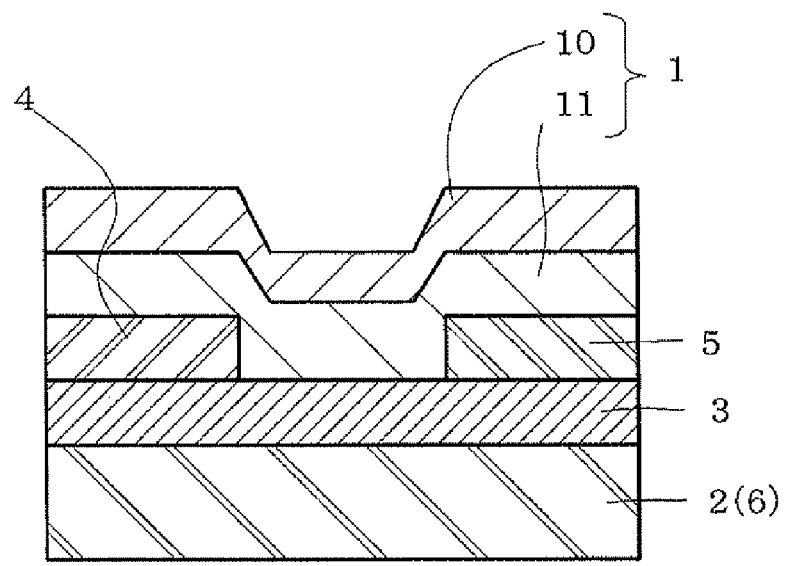
FIG. 1A is a schematic cross-sectional view of the semiconductor and the semiconductor device according to a first embodiment of the invention.

The embodiments of the semiconductor of the invention and the semiconductor device using thereof are described below referring to the drawings.
First Embodiment FIG. 1 shows a schematic cross-sectional view of the semiconductor and the semiconductor device according to the first embodiment of the invention.

As shown in FIG. 1, the semiconductor device of this embodiment is provided with a semiconductor 1, a first electrode 2, an insulating layer 3 interposed between the semiconductor 1 and the first electrode 2, a second electrode 4 disposed nearer to the semiconductor 1 than the insulating layer 3, and a third electrode 5 which is detached from the second electrode 4 and disposed nearer to the semiconductor 1 than the insulating layer 3. The semiconductor 1 of this embodiment is formed of an organic semiconductor layer 10 and an oxide semiconductor layer 11.

This semiconductor device, which can be used as a field effect transistor (FET), a light-emitting element, a light-receiving element, and the like, has a configuration that the layers in the form of a thin film are stacked on a substrate 6.

Specifically, the semiconductor device is provided with the substrate 6 used as the first electrode 2, the insulating layer 3 formed on the substrate 6, the semiconductor 1 formed on the insulating layer 3, and the second and third electrodes 4 and 5 provided between the insulating layer 3 and the semiconductor 1 as being spaced apart from each other.

The semiconductor 1 of the invention has ambipolar characteristics, i.e., exhibits both n-type and p-type characteristics.

In this embodiment, the semiconductor 1 is provided with an organic semiconductor layer 10 formed of an organic substance and an oxide semiconductor layer 11 formed of an oxide. The organic semiconductor layer 10 and the oxide semiconductor layer 11 are formed as being extending from the side of the second electrode 4 to the side of the third electrode 5.

The organic semiconductor layer 10 and the oxide semiconductor layer 11 are in contact with each other.

It is preferred that the semiconductor 1 have a configuration selected from the followings: a configuration in which the entire organic semiconductor layer 10 has p-type characteristics and the entire oxide semiconductor layer 11 has n-type characteristics; a configuration in which the entire organic semiconductor layer 10 has n-type characteristics and the entire oxide semiconductor layer 11 has p-type characteristics; and a configuration in which the entire organic semiconductor layer 10 has ambipolar characteristics and the entire oxide semiconductor layer 11 has p-type or n-type characteristics. Of these, the semiconductor 1 with a configuration in which the entire organic semiconductor layer 10 has p-type characteristics and the entire oxide semiconductor layer 11 has n-type characteristics is preferable since the band gap of an n-type oxide semiconductor is larger than the band gap of an n-type organic semiconductor.

The organic semiconductor layer 10 is formed of an organic substance with p-type characteristics, an organic substance with ambipolar characteristics, an organic substance with n-type characteristics, or a stacked body or a mixture body composed of two or more of the organic substances.

The term "mixture body" as referred to herein means a body in which organic substances are mixed uniformly in the semiconductor layer, a body in which a plurality of aggregates of organic substances are arranged in the layer direction of the organic semiconductor layer 10, or the like.

Specifically, the organic semiconductor layer 10 is formed of at least one selected from an organic low molecular compound such as pentacene and oligothiophene, an organic high molecular compound such as polythiophene, a metal complex such as phthalocyanine, a fullerene such as C60, C82, and metal-incorporated fullerene (fullerene in which dysprosium (Dy) is incorporated (Dy@C82)), and a carbon nanotube.

Of the above-mentioned organic substances constituting the organic semiconductor layer 10, an organic substance with p-type characteristics or an organic substance with ambipolar characteristics, or a stacked body or a mixture body composed of the above-mentioned organic substances is preferable.

In particular, an organic semiconductor layer 10 formed of an organic substance with p-type characteristics or a stacked body or mixture body composed of an organic substance with p-type characteristics is preferable since characteristics of an organic substance with p-type characteristics deteriorate only slightly when exposed to the air.

Examples of the organic substance with p-type characteristics constituting the organic semiconductor layer 10 include pentacene, tetracene, anthracene, phthalocyanine, α-sexithiophene, α,ω-dihexyl-sexithiophene, oligophenylene, oligophenylenevinylene, dihexyl-anthradithiophene, bis(dithienothiophene), poly(3-hexylthiophene), poly(3-butylthiophene), poly(phenylenevinylene), poly(thienylenevinylene), polyacetylene, α,ω-dihexyl-quinquethiophene, TPD, α-NPD, m-MTDATA, TPAC, TCTA, and Poly(vinylcarbazole).

Examples of the organic substances with n-type characteristics which constitute the organic semiconductor layer 10 include C6-PTC, C8-PTC, C12-PTC, C13-PTC, Bu-PTC, F7Bu-PTC*, Ph-PTC, F5Ph-PTC*, PTCBI, PTCDI, TCNQ, and C60 fullerene.

Examples of the organic substances with ambipolar characteristics which constitute the organic semiconductor layer 10 include pentacene, rubrene, cupper phthalocyanine, and tetracene, each of them having a high degree of purity.

In this embodiment, as the method for forming the organic semiconductor layer 10, besides the chemical film-forming method such as spraying, dipping, and CVD, the physical film-forming method such as vacuum vapor deposition can also be used. The physical film-forming method is more preferable in respect of carrier density controllability or film quality improvement.

The oxide semiconductor layer 11 is formed of a non-degenerated oxide having n-type characteristics.

In this embodiment, the oxide semiconductor layer 11 is a transparent oxide semiconductor layer.

It is preferred that the oxide semiconductor layer 11 be formed of an amorphous oxide containing at least any of In, Zn, Sn, and Ga. It is more preferred that the oxide semiconductor layer 11 be formed of any of an amorphous oxide containing In, Ga, and Zn, an amorphous oxide containing Sn, Zn, and Ga, an amorphous oxide containing In and Zn, an amorphous oxide containing In and Sn, an amorphous oxide containing In and Ga, or an amorphous oxide containing Zn and Sn. Due to a relatively large s-orbit, In, Sn, Zn, and Ga exhibit excellent n-type semiconductor characteristics even in an amorphous state, and have excellent semiconductor characteristics such as mobility due to improved electron-transporting characteristics.

Alternatively, it is preferred that the oxide semiconductor layer 11 be formed of a polycrystalline oxide containing any of In, Zn, Sn, and Ga. It is more preferred that the oxide semiconductor layer 11 be formed of a polycrystalline oxide containing In and a positive divalent element. A polycrystalline oxide containing any of In, Zn, Sn, and Ga can control carrier density by adjusting an oxygen partial pressure at the time of formation or by conducting an oxidizing treatment after formation. In, Sn, Zn, and Ga exhibit excellent n-type semiconductor characteristics due to a relatively large s-orbit, and have improved semiconductor characteristics such as mobility due to excellent electron transporting characteristics. In particular, In has a large s-orbit, and hence, even in a more polycrystalline state, deterioration of electron-transporting characteristics caused by grain boundary diffusion will not be significant. In addition, carrier density can be controlled to a desired level only by changing the concentration of a positive divalent element without treating at high temperatures of 450° C. or higher.

As compared with an amorphous oxide containing at least any of In, Zn, Sn, and Ga, it is preferred that the oxide semiconductor layer 11 be formed of a polycrystalline oxide containing any of In, Zn, Sn, and Ga. In particular, a polycrystalline oxide containing In and Zn is more preferable. The reason therefor is that a polycrystalline oxide containing any of In, Zn, Sn, and Ga enables simultaneous achievement of controlled (decreased) electron carrier density and higher electron mobility, whereby a high degree of reliability is attained.

Examples of the positive divalent element include Zn, Be, Mg, Ca, Sr, Ba, Ti, V, Cr, Mn, Fe, Co, Ni, Pd, Pt, Cu, Ag, Cd, Hg, Sm, Eu, and Yb. Of these, Zn, Mg, Mn, Co, Ni, Cu, and Ca are preferable. Of these, Zn, Mg, Cu, Ni, Co, and Ca are more preferable since they are capable of controlling carrier density efficiently. In respect of carrier control by addition of these elements, Cu and Ni are particularly preferable. In respect of transmittance and band gap width, Zn and Mg are particularly preferable. These positive divalent elements may be added in combination insofar as the effects of this embodiment are not impaired. The term "positive divalent element" as referred to herein means an element which can have two positive valences in the ionic state.

The oxide semiconductor layer 11 may contain other elements or compounds than indium oxide and an oxide of a positive divalent element. Normally, the oxide semiconductor layer 11 contains 50 mass % or more of indium oxide and an oxide of a positive divalent element. If the content of indium oxide and an oxide of a positive divalent element is smaller than 50 mass %, effects may not be developed sufficiently, and for example, mobility may lower. For sufficient development of effects, it is preferred that indium oxide and an oxide of a positive divalent element be contained in a total amount of 65 mass % or more, more preferably 80 mass % or more, still more preferably 90 mass % or more, and particularly preferably 95 mass % or more. To allow the effects of carrier control to be fully developed, the content of a positive tetravalent element such as Sn is preferably 3 mass % or less, more preferably 2 mass % or less, and particularly preferably 1 mass % or less. Carrier density may not be controlled to a low level by the presence of a positive tetravalent element.

[X/(X+In)], an atomic ratio of indium [In] and a positive divalent element [X] contained in the oxide semiconductor layer 11, may be 0.0001 to 0.5.

If the atomic ratio [X/(X+In)] is smaller than 0.0001, which means a smaller content of a positive divalent element, the effects of the this embodiment are not developed, and hence, the number of carriers cannot be controlled.

On the other hand, if the atomic ratio [X/(X+In)] is larger than 0.5, which means an excessive content of the positive divalent element, instability may occur since an interface or surface tends to be modified, crystallization may be difficult due to a high crystallization temperature, carrier density may be increased, and hole mobility may lower. In addition, threshold voltage may vary or driving may be unstable when driving a transistor. In order to avoid the above problems more effectively, the atomic ratio [X/(X+In)] is preferably in the range of 0.0002 to 0.15, more preferably 0.0005 to 0.1, still more preferably 0.01 to 0.099, and particularly preferably 0.005 to 0.095. Most preferably, the atomic ratio [X/(X+In)] is 0.06 to 0.09.

The oxide semiconductor layer 11 preferably have an electron carrier density of less than $10^{18}/cm^3$, more preferably less than $10^{17}/cm^3$, still more preferably less than $5\times10^{16}/cm^3$, and particularly preferably less than $10^{16}/cm^3$.

Although there are no particular restrictions on the lower limit, the electron carrier density is normally $10^{10}/cm^3$ or more, preferably $10^{12}/cm^3$ or more. If the electron carrier density is $10^{18}/cm^3$ or more, the oxide semiconductor layer may not be well-balanced with the organic semiconductor in respect of conductivity. As a result, the semiconductor may not exhibit ambipolar characteristics.

In the invention, the term "amorphous oxide" means a compound which shows a hallow pattern and does not show a specific diffraction line in the X-ray spectrum, and the term "polycrystalline oxide" means a compound which shows a specific diffraction line in the X-ray spectrum.

The electron carrier density of the oxide according to the invention is a value measured at room temperature. The term "room temperature" means, for example, 25° C. Specifically, the room temperature is a certain temperature selected appropriately from a range of about 0° C. to 40° C. The electron carrier density of the oxide according to the invention is not required to be $10^{18}/cm^3$ or less in the entire range of 0° C. to 40° C. For example, it will suffice if the electron carrier density is less than $10^{18}/cm^3$ at 25°C. The semiconductor exhibiting ambipolar characteristics can be obtained in a high yield at a further lower electron carrier density, i.e., $10^{17}/cm^3$ or less, more preferably $10^{16}/cm^3$.

It is preferred that the oxide semiconductor layer 11 is formed of an oxide containing a lanthanide. The oxide semiconductor layer 11 can have a larger work function by the presence of a lanthanide.

Further, the oxide semiconductor layer 11 preferably has a work function of 4.8 (eV) or more, more preferably 5.2 (eV) or more, and particularly preferably 5.6 (eV) or more.

The oxide semiconductor layer 11 preferably has a band gap of 2.5 (eV) or more, more preferably 2.8 (eV) or more, and particularly preferably 3.1 (eV) or more. If the band gap is smaller than 2.5 (eV), a larger amount of visible rays is absorbed, and as a result, lowering of transparency, coloring, and light deterioration may occur.

The refractive index of the oxide semiconductor layer 11 is preferably 2.3 or less, more preferably 2.1 or less, and particularly preferably 2.0 or less. If the refractive index is larger than 2.3, an increased reflectance or other problems may occur when an organic semiconductor layer is stacked thereon.

Figure 1B:
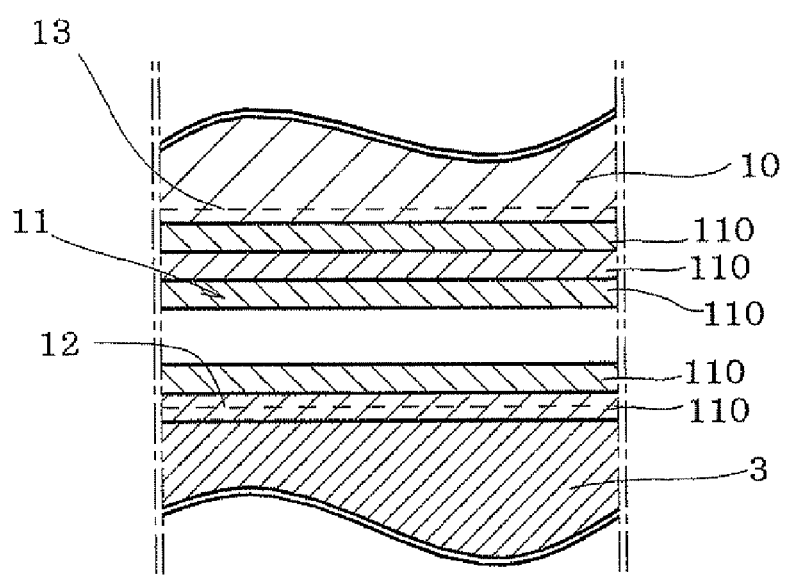
FIG. 1B is an enlarged cross-sectional view of an essential part of the semiconductor and the semiconductor device according to a first embodiment of the invention.

As shown in FIG. 1(b), the oxide semiconductor layer 11 may be a stacked structure in which a plurality of layered oxides 110 are stacked. In this case, of the stacked layered oxides 110, a layered oxide closest to the organic semiconductor layer 10 may preferably be formed of a material which allows the layered oxide to have a work function larger than the work function of other layered oxides.

Increasing the work function of the oxide semiconductor layer 11 by addition of a lanthanide, for example, or configuring to have the above-mentioned stacked structure, a hole to be injected from the second or the third electrode 4, 5 to the organic semiconductor layer 10 can be able to pass through the oxide semiconductor layer 11 readily. As a result, the semiconductor device can have improved characteristics.

In this embodiment, as the methods for forming the oxide semiconductor layer 11, not only the chemical film-forming method such as spraying, dipping, and CVD, but also the physical film-forming method can be used. Considering carrier density controllability and film quality improvement, the physical film-forming method is more preferable.

Examples of the physical film-forming method include sputtering, vacuum vapor deposition, ion plating, and pulse laser deposition. For film forming on the industrial scale, sputtering is preferable due to high mass producibility.

Examples of sputtering include DC sputtering, RF sputtering, AC sputtering, ECR sputtering, and opposed target sputtering. Of these, DC sputtering or AC sputtering is preferred since industrial mass producibility is high and control of carrier density can be performed more readily than RF sputtering. To avoid degradation of an interface by film formation to suppress current leakage and to improve characteristics such as on-off ratio of the oxide semiconductor layer 11, ECR sputtering or opposed sputtering is preferable to facilitate film quality control.

The distance between the substrate and the target (S-T distance) at the time of sputtering is normally 150 mm or less, preferably 110 mm or less, particularly preferably 80 mm or less. If the S-T distance is short, film quality is expected to be improved since the substrate is exposed to plasma during sputtering. An S-T distance longer than 150 mm is not suitable for industrial application due to a low film-formation speed.

In the case of film formation by sputtering, a sintered target containing oxygen may be used. Alternatively, reactive sputtering may be performed using a target formed of a metal or an alloy while introducing a gas such as oxygen.

In respect of reproducibility, uniformity in a large area, and characteristics of a TFT, it is preferable to use a sintered target containing oxygen.

In producing a sintered target, it is preferred that sintering be performed under a reduced atmosphere. Further, the bulk resistance of a sintered target is preferably 0.001 to 1,000 mΩcm, more preferably 0.01 to 100 mΩcm. The sintering density of a sintered target is normally 70%, preferably 85% or more, more preferably 95% or more, and particularly preferably 99% or more.

When sputtering is performed, the ultimate vacuum is normally $5 \times 10^{-2}$ Pa or less. If the ultimate vacuum is larger than $5 \times 10^{-2}$ Pa, mobility may lower due to supply of a large amount of hydrogen atoms from $H_2O$ in the atmosphere gas. The reason therefor is assumed to be a change in the crystal structure of indium oxide caused by bonding of a hydrogen atom.

To avoid such a problem more effectively, the ultimate vacuum is preferably $5 \times 10^{-3}$ Pa or less, more preferably $5 \times 10^{-4}$ Pa or less, still more preferably $1 \times 10^{-4}$ Pa or less, and particularly preferably $5 \times 10^{-5}$ Pa or less.

The oxygen partial pressure of the atmosphere gas is normally $40 \times 10^{-3}$ Pa or less. If the oxygen partial pressure of the atmosphere gas is larger than $40 \times 10^{-3}$ Pa, mobility may lower or carrier density may be unstable. The reason therefor is assumed to be as follows. If the amount of oxygen is too large during film formation, the amount of oxygen incorporated between lattices of a crystal becomes too large to cause diffusion, or oxygen is removed readily from a film to make the carrier density unstable.

To avoid such a problem more effectively, the partial oxygen pressure of the atmosphere gas is preferably $15 \times 10^{-3}$ Pa or less, more preferably $7 \times 10^{-3}$ Pa or less, and particularly preferably $1 \times 10^{-3}$ Pa or less.

The concentration of water $H_2O$ or hydrogen $H_2$ is normally 1.2 vol % or less. If the concentration of $H_2O$ or $H_2$ in the atmosphere gas is larger than 1.2 vol %, hole mobility may lower. To avoid such a problem more effectively, the concentration of $H_2O$ or $H_2$ in the atmosphere gas is preferably 1.0 vol % or less, more preferably 0.1 vol % or less, and particularly preferably 0.01 vol % or less.

In such a film forming process, if the oxide semiconductor layer 11 is formed of a polycrystalline oxide, either of the following methods may be used. One of the methods is forming a polycrystalline film. Another is a method in which a film is formed, and the film thus formed is crystallized or the crystallinity thereof is improved during the post treatment.

In the method in which the polycrystalline film is formed, the film is formed at a substrate temperature of normally at 250° C. to 550° C., preferably 300° C. to 500° C., and more preferably 320° C. to 400° C. If the substrate temperature is 250° C. or less, carrier density may be low due to low crystallinity. A substrate temperature exceeding 550° C. may result in cost increase or substrate deformation.

In the method in which crystallization or improvement of crystallinity is conducted in the post treatment after film formation, the film is formed by the physical method at a substrate temperature of 250° C. or less. If the substrate temperature is higher than 250° C., the effects of the post treatment are not fully developed, and as a result, it may be difficult to control carrier density to low and mobility to high. To avoid such a problem more effectively, the substrate temperature is preferably 200° C. or less, more preferably 150° C. or less, still more preferably 100° C. or less, and particularly preferably 50° C. or less.

Although formation of a film containing a crystalline substance is preferable from an industrial viewpoint since the process is simple, conducting crystallization in the post treatment after film formation is more preferable to obtain excellent semiconductor characteristics since crystallinity is high, film stress is low, and carriers are easy to control. A film may contain crystals before being crystallized in the post treatment. However, crystallization of an amorphous film in the post treatment after the film formation is preferable since crystallinity is easy to control, and as a result, a semiconductor of high quality can be obtained.

If a film with a large area is formed by sputtering, a method such as rotating a folder to which a substrate is secured and moving a magnet to obtain a broader erosion range is preferable to obtain a uniform film.

It is also possible that, after such a film formation process, carrier density of the transparent oxide semiconductor layer 11 can be controlled by oxidization or crystallization.

Controlling carrier density by adjusting the concentration of gas components such as oxygen during film formation may be possible. However, hole mobility may lower by this method. The reason therefor is assumed to be entering of gas components, which have been introduced for carrier control, to a film, causing diffusion.

In forming the oxide semiconductor layer 11, if a polycrystalline film is used, it is preferred that an amorphous film be formed first, followed by crystallization of the amorphous film at the time of oxidization. As a result, a low carrier density can be realized while keeping hole mobility at a high level.

As the oxidization or crystallization treatment, a heat treatment is conducted in the presence or absence of oxygen normally at a temperature of 80° C. to 650° C. for 0.5 to 12,000 minutes. The oxidization or crystallization treatment is preferably conducted in the presence of oxygen, since a decrease in oxygen deficiency can be expected to occur simultaneously.

If the heat treatment is conducted at 80° C. or lower, the effects of the treatment may not be developed or the treatment may take a too long time. A heat treatment temperature higher than 650° C. may result in an increased energy cost, a prolonged tact time, an increased threshold voltage of a transistor, and deformation of a substrate. To avoid such a problem more effectively, the treatment is conducted preferably at 120° C. to 500° C., more preferably 150° C. to 450° C., still more preferably 180° C. to 350° C., and particularly preferably 200° C. to 300° C. Most preferably, the treatment is conducted at 220° C. to 290° C.

If the heat treatment time is shorter than 0.5 minutes, the treatment is not effective since the time required to heat the inside of the layer becomes insufficient. If the treatment time is longer than 12,000 minutes, the treatment may require a larger apparatus, which is not industrially applicable, or the substrate may be broken or deformed during processing. To avoid such a problem more effectively, the treatment time is preferably 1 to 600 minutes, more preferably 5 to 360 minutes, still more preferably 15 to 240 minutes, and particularly preferably 30 to 120 minutes.

As the oxidization or crystallization treatment, a heat treatment may be conducted, in the presence or absence of oxygen, using a lamp annealer (LA), a rapid thermal annealer (RTA), or a laser annealer. Alternatively, as the oxidization or crystallization treatment, an atmospheric plasma treatment, an oxygen plasma treatment, an ozone treatment, or an irradiation treatment such as UV irradiation may be used. These methods may be used in combination, for example, a substrate is subjected to an ozone treatment while heating and irradiating with UV rays.

When a heat treatment is conducted, it is preferred that the temperature of the film at the time of the heat treatment is higher than the temperature of the substrate at the time of film formation by 100° C. to 270° C. If the temperature difference is smaller than 100° C., the effects of the treatment may not be developed. If the temperature difference is larger than 270° C., the substrate may be deformed or the interface of the thin films of the semiconductor is modified to lower the semiconductor characteristics. To avoid such a problem more effectively, the film temperature at the time of heat treatment is higher than the substrate temperature at the time of film formation more preferably by 130° C. to 240° C., particularly preferably 160° C. to 210° C.

The substrate 6 is formed of an inorganic or organic substance.

Specific examples of the substrate 6 formed of an inorganic substance include a p-type single crystal silicon substrate to which boron (B), phosphor (P), antimony (Sb) or the like is added as impurities, an n-type single crystal silicon substrate, a glass substrate, and a quarts substrate.

Specific examples of the substrate formed of an organic substance include substrates of plastics such as polymethylmethacrylate, polyethersulfone and polycarbonate.

In this embodiment, since the substrate 6 is used also as the first electrode 2, the substrate 6 is a silicon substrate 6.

In the insulating layer 3, an oxide such as $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, and AlN may be used. Of these, $SiO_2$, SiNx, $Al_2O_3$, $Y_2O_3$, $Hf_2O_3$ and $CaHfO_3$ are preferable. $SiO_2$, SiNx, $Y_2O_3$, $Hf_2O_3$ and $CaHfO_3$ are still more preferable, with particular preference being $Y_2O_3$. The number of oxygen atoms in these oxides does not necessarily coincide with the stoichiometric ratio (for example, either $SiO_2$ or SiOx may be possible).

The gate insulating film 3 may be a stacked structure in which two or more different insulating layers are stacked. The gate insulating layer 3 may be of crystalline, polycrystalline, or amorphous. To facilitate industrial production, the gate insulating layer 3 may preferably be of polycrystalline or amorphous.

It is also possible to use an organic insulator such as parylene and polystyrene in the insulating layer 3.

As for the material for the second and third electrodes 4 and 5, there are no particular restrictions. Various metals, metal oxides, carbon, organic conductive materials, or the like may be used. Specific examples include platinum (Pt), gold (Au), silver (Ag), cupper (Cu), aluminum (Al), an Mg—Ag alloy, an Li—Al alloy, calcium, an indium-tin alloy (ITO), an indium-zinc oxide, a zinc-tin oxide, a tin oxide, a zinc oxide, and a titanium-niobium oxide may preferably be used.

The semiconductor and the semiconductor device are produced as follows, for example.

In this embodiment, a silicon substrate is used as the substrate 6. The insulator layer 3 is a thermal oxidized $SiO_2$ layer, which is obtained by subjecting the silicon substrate 6 to thermal oxidation. An oxide with n-type characteristics is used as the material for the oxide semiconductor layer 11 and an organic substance with p-type characteristics are used as the material for the organic semiconductor layer 10.

First, the insulating layer 3 is formed on the substrate 6. The second and third electrodes 4 and 5 are formed on the insulating layer 3 by vacuum vapor deposition. Subsequently, the oxide semiconductor layer 11 is formed thereon using a sputtering apparatus or the like. The organic semiconductor layer 10 is formed on the top of the oxide semiconductor layer 11 by vacuum vapor deposition.

In this configuration, since an organic substance with p-type characteristics is used in the organic semiconductor layer 10, and an organic substance with an n-type characteristics is used in the oxide semiconductor layer 11, characteristics of the semiconductor deteriorate only slightly even if the oxide semiconductor layer which is an n-type semiconductor layer is exposed to air during production.

Such a semiconductor device can be used as a field effect transistor, a light emitting device, and a light receiving device, for example.

If the semiconductor device is used as an n-type field effect transistor, the first electrode 2 is used as a gate electrode. Of the second electrode 4 and the third electrode 5, a higher-voltage electrode is used as a drain electrode, and a lower-voltage electrode is used as a source electrode. If the semiconductor device is used as a p-type field effect transistor, the first electrode 2 is used as a gate electrode. Of the second electrode 4 and the third electrode 5, a higher-voltage electrode is used as a source electrode, and a lower voltage electrode is used as a drain electrode.

Operation mechanism of the semiconductor device as a field effect transistor is considered to be as follows.

If a positive voltage is applied to the gate electrode, electrons of the oxide semiconductor layer 11 assemble on the side nearer to the insulating layer 3 of the oxide semiconductor layer 11. Electrons from the source electrode pass through a layer (12) of electrons assembled on the side nearer to the insulating layer 3 of the oxide semiconductor layer 11. As a result, a current flows from the source electrode to the drain electrode.

If a negative voltage is applied to the gate electrode, holes of the organic semiconductor layer 10 assemble on the side nearer to the oxide semiconductor layer 11 of the organic semiconductor layer 10. Holes from the source electrode pass through a layer (13) of holes assembled on the side nearer to the insulating layer 3 of the organic semiconductor layer 10. As a result, a current flows from the source electrode to the drain electrode.

Due to the provision of the organic semiconductor layer 10 and the oxide semiconductor layer 11, the semiconductor of this embodiment can exhibit stable ambipolar characteristics. As for the materials used in the semiconductor 1, an organic substance with p-type or ambipolar-type characteristics is used in the organic semiconductor layer 10, and an n-type oxide is used in the oxide semiconductor layer 11. As a result, stable electron carrier mobility can be ensured, which leads to stable operation of the semiconductor device.

In particular, the oxide semiconductor layer formed of an n-type oxide exhibits remarkably excellent carrier mobility as compared with the conventional semiconductor layer formed of an n-type organic substance. Therefore, the semiconductor device can be easily put into practical use since the semiconductor device exhibits excellent semiconductor characteristic in the air.

An oxide with n-type characteristics has a larger band gap and absorbs a smaller amount of visible rays as compared with an organic substance with n-type characteristics, and hence, it may hardly deteriorate by exposure to light.

In this embodiment, the field effect mobility of the semiconductor is normally $10^{-4}$ $cm^2/Vs$ or more. If the field effect mobility is smaller than $10^{-4}$ $cm^2/Vs$, switching speed may be low or the semiconductor may not exhibit ambipolar characteristics. To avoid such a problem more effectively, the field effect mobility is preferably $10^{-3}$ $cm^2/Vs$ or more, more preferably $10^{-2}$ $cm^2/Vs$ or more, still more preferably $10^{-1}$ $cm^2/Vs$ or more, and particularly preferably 1 $cm^2/Vs$ or more.

A ratio ($\mu(n)/\mu(p)$) of a field effect mobility ($\mu(n)$) at the time of n-type driving and a field effect mobility ($\mu(p)$) at the time of p-type driving is normally within a range of $10^{-5} \leq \mu(n)/\mu(p) \leq 10^5$, preferably $10^{-3} \leq \mu(n)/\mu(p) \leq 10^4$, more preferably $10^2 \leq \mu(n)/\mu(p) \leq 10^3$, and particularly preferably $10^1 \leq \mu(n)/\mu(p) \leq 10^2$. If the ratio $\mu(n)/\mu(p)$ is outside the above range, n-type characteristics and p-type characteristics may be ill-balanced, resulting in insufficient development of ambipolar characteristics. The semiconductor can be operated stably when the balance of the field effect mobility at the time of n-type driving and the field effect mobility at the time of p-type driving is optimized.

A ratio (W/L) of the channel width W and the channel length L is normally 0.1 to 100, preferably 1 to 20, and particularly preferably 2 to 8. If the ratio W/L exceeds 100, an amount of leakage current may be increased and the on-off ratio may be reduced. If the ratio W/L is smaller than 0.1, field effect mobility may lower and occurrence of pinch-off may become unclear.

The channel length L is normally 0.1 to 1,000 μm, preferably 1 to 100 μm, and more preferably 2 to 10 μm. A semiconductor with a channel length shorter than 0.1 μm is not only difficult to produce on the industrial scale, but also may suffer short channel effects or an increased leakage current. A channel length exceeding 1,000 μm is not preferable since it makes the device size too large.

A voltage applied between electrodes at the time of driving is normally 100 V or less, preferably 50 V or less, more preferably 20 V or less, and still more preferably 10 V or less. If the voltage is larger than 100 V, power consumption becomes too large to make the semiconductor difficult to be put into practical use.

The expression "exhibit ambipolar characteristics" as referred to herein means the presence of a drain voltage which creates a region in which a drain current is increases by increasing a gate voltage and a region in which a drain current increases by decreasing a gate voltage.

Second Embodiment

Figure 2:
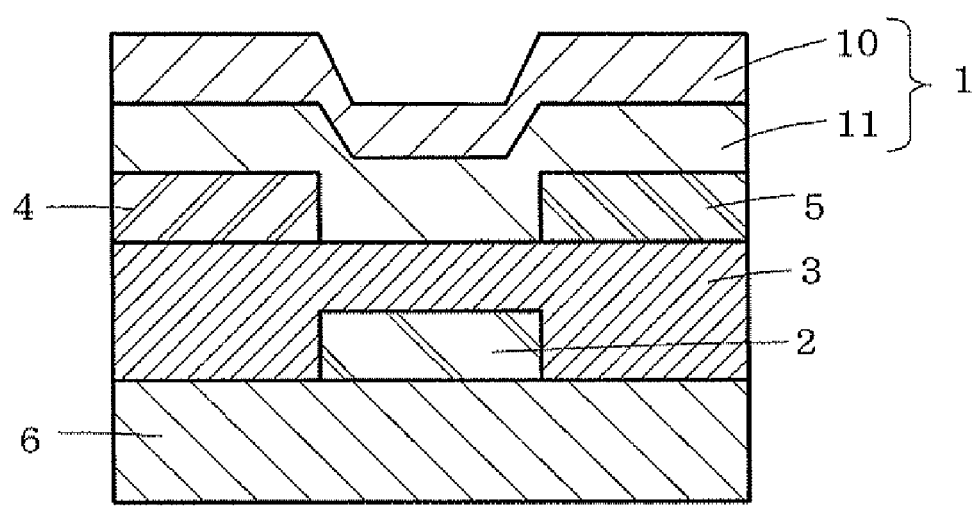
FIG. 2 is a schematic cross-sectional view of the semiconductor and the semiconductor device according to a second embodiment of the invention.

FIG. 2 shows a schematic cross sectional view of the semiconductor and the semiconductor device according to the second embodiment of the invention.

The semiconductor device of this embodiment is substantially similar to the semiconductor device in the first embodiment, except that the substrate 6 and the first electrode 2 are provided separately.

Specifically, in the semiconductor and the semiconductor device in this embodiment, the first electrode 2 is separately provided in the middle of the substrate 6. This first electrode 2 is formed of the material used in the second and third electrodes 4 and 5 in the first embodiment. The insulating layer 3 is provided on the substrate 6 as well as on the first electrode 2.

Except for the above, the configuration of the semiconductor and the semiconductor device in this embodiment is the same as that in the first embodiment.

The semiconductor device in this embodiment is used as a field effect transistor as in the case of the first embodiment. The operation and effect are almost similar to those mentioned above.

By the semiconductor configuration of this second embodiment, the degree of circuit design allowance of the semiconductor is enhanced due to separate provision of the gate electrode and the substrate 6.

Third Embodiment

Figure 3:
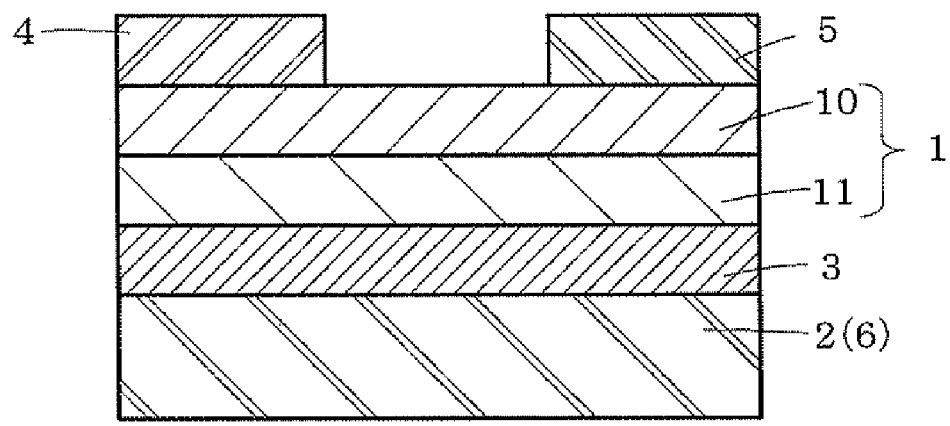
FIG. 3 is a schematic cross-sectional view of the semiconductor and the semiconductor device according to a third embodiment of the invention.

FIG. 3 shows a schematic cross sectional view of the semiconductor and the semiconductor device according to the third embodiment of the invention.

The semiconductor device of this embodiment is substantially similar to the semiconductor device in the first embodiment, except that the second and third electrodes 4 and 5 are not interposed between the insulating layer 3 and the oxide semiconductor layer 11, and are provided on the top of the organic semiconductor layer 10.

Since the insulating layer 3, the oxide semiconductor layer 11, and the organic semiconductor layer 10 are all provided between the first electrode 2(6) and the second and third electrodes 4 and 5, a field can be applied effectively to allow the semiconductor characteristics to be developed easily. In addition, the second and third electrodes 4 and 5 are in direct contact with the organic semiconductor layer 10, the semiconductor easily develops ambipolar characteristics even when mobility of the organic semiconductor is low.

Fourth Embodiment

Figure 4:
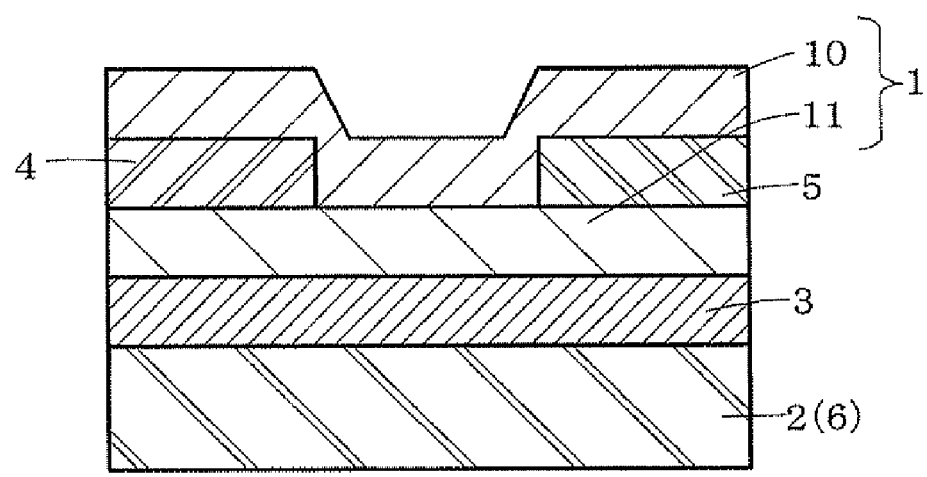
FIG. 4 is a schematic cross-sectional view of the semiconductor and the semiconductor device according to a fourth embodiment of the invention.

FIG. 4 shows a schematic cross sectional view of the semiconductor and the semiconductor device according to the fourth embodiment of the invention.

The semiconductor device of this embodiment is substantially similar to the semiconductor device in the first embodiment, except that the second and third electrodes 4 and 5 are not interposed between the insulating layer 3 and the oxide semiconductor layer 11, and are provided between the organic semiconductor layer 10 and the oxide semiconductor layer 11.

Since the second and third electrodes 4 and 5 are in contact with both the organic semiconductor layer 10 and the oxide semiconductor layer 11, the semiconductor easily develops ambipolar characteristics.

Fifth Embodiment

Figure 5:
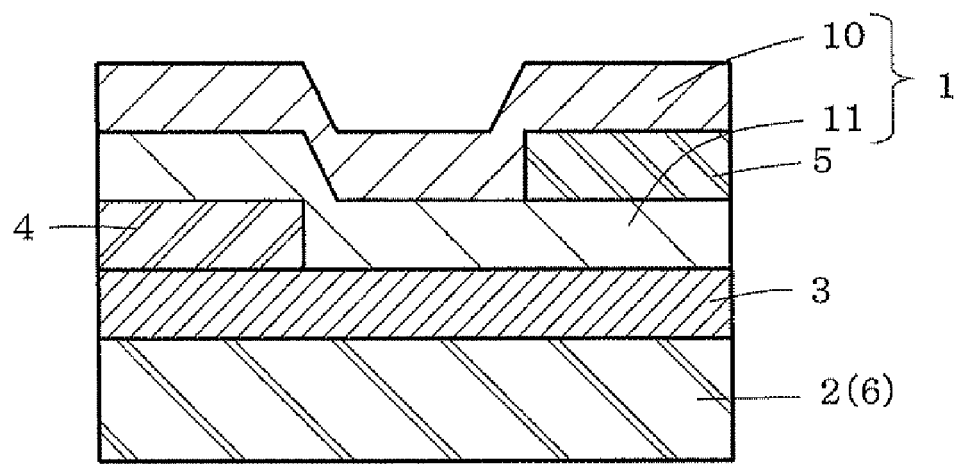
FIG. 5 is a schematic cross-sectional view of the semiconductor and the semiconductor device according to a fifth embodiment of the invention.

FIG. 5 shows a schematic cross sectional view of the semiconductor and the semiconductor device according to the fifth embodiment of the invention.

The semiconductor device of this embodiment is substantially similar to the semiconductor device in the first embodiment, except that the third electrode 5 is not interposed between the insulating layer 3 and the oxide semiconductor layer 11, and is provided between the organic semiconductor layer 10 and the oxide semiconductor layer 11.

Since current from the second and third electrodes passes through both the organic semiconductor layer 10 and the oxide semiconductor layer 11, the semiconductor easily develops ambipolar characteristics. In addition, since one of the second electrode and the third electrode is in contact with the organic semiconductor layer 10, the semiconductor easily develops ambipolar characteristics even when mobility of the organic semiconductor is low.

Sixth Embodiment

Figure 6:
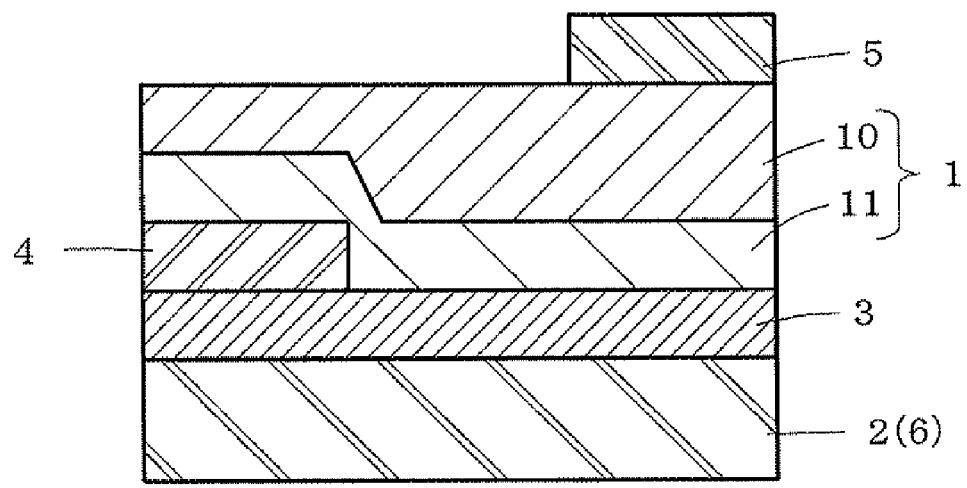
FIG. 6 is a schematic cross-sectional view of the semiconductor and the semiconductor device according to a sixth embodiment of the invention.

FIG. 6 shows a schematic cross sectional view of the semiconductor and the semiconductor device according to the sixth embodiment of the invention.

The semiconductor device of this embodiment is substantially similar to the semiconductor device in the first embodiment, except that the third electrode 5 is not interposed between the insulating layer 3 and the oxide semiconductor layer 11, and is provided on the top of the organic semiconductor layer 10.

Since current from the second and third electrodes passes through both the organic semiconductor layer 10 and the oxide semiconductor layer 11, the semiconductor easily develops ambipolar characteristics.

Due to the configuration of the semiconductor in the third to sixth embodiments, the degree of circuit design allowance of the semiconductor is enhanced since the position of the second and third electrodes 4 and 5 relative to the organic semiconductor layer 10 and the oxide semiconductor layer 11 of the semiconductor 1 may be set as mentioned above.

The semiconductor device in the first to sixth embodiments can be used in, for example, a complementary transistor circuit device such as an NOT circuit. A complementary transistor circuit is provided with a plurality of semiconductor devices, and the semiconductor device of the invention is used in at least one of the plurality of semiconductor devices.

Figure 7:
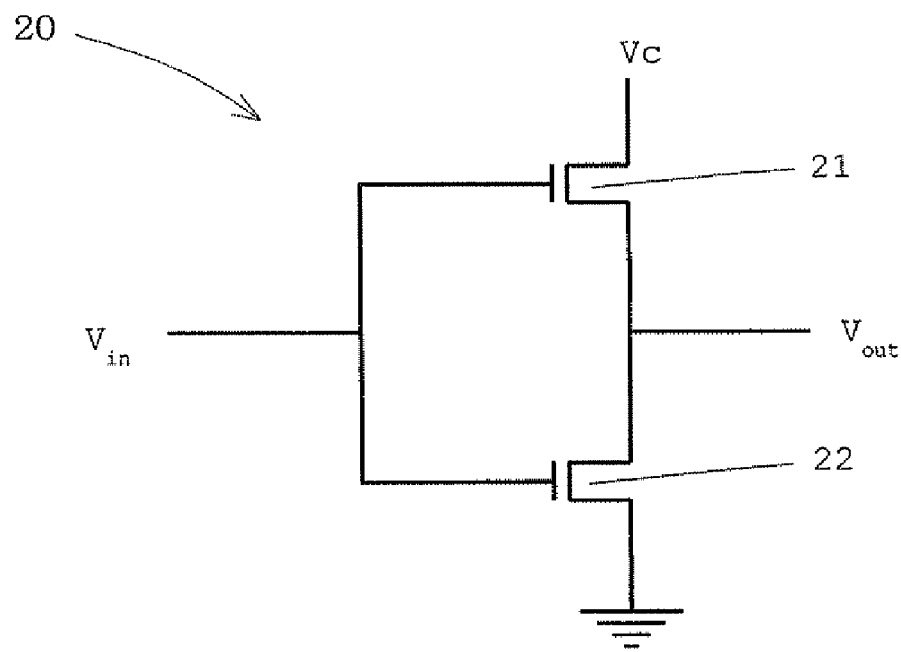
FIG. 7 is a view showing a complementary transistor circuit device according to one embodiment of the invention.

Specifically, as shown in FIG. 7, a complementary transistor circuit device 20 has two field effect transistors 21 and 22. The semiconductor device of the invention is used in at least one of the transistors 21 and 22 (21 in this embodiment).

In this circuit device 20, the semiconductor device is used in the field effect transistor 21 when two field effect transistors 21 and 22 are formed on a single substrate. Therefore, the remaining field effect transistor 22 may be of any of an n-type semiconductor device, a p-type semiconductor device, and ambipolar semiconductor device. As a result, separate production of an n-type semiconductor device and a p-type semiconductor device becomes unnecessary, leading to a decrease in production cost of the entire device.

EXAMPLES

Example 1

The example of the semiconductor device of the first embodiment will be described.

As shown in FIG. 1(*a*), the semiconductor device of this example was produced by the following method.

A conductive silicon substrate was used as the substrate 6. The substrate 6 was subjected to thermal oxidation to form the insulating layer 3. On the insulating layer 3 thus formed, a positive photoresist was applied by spin coating, followed by pre-baking at a predetermined temperature to solidify. The middle of the substrate 6 was exposed to light. Subsequently, the photoresist on parts other than the middle of the substrate 6 was removed by washing with a rinsing solution, followed by post-baking to vaporize the remaining rinsing solution, On the substrate 6, a Cr film and an Au film were formed by vacuum vapor deposition, and the resultant films were subjected to a lift-off processing with a solvent, thereby forming the second and third electrodes 4 and 5 in a part other than the middle of the substrate 6.

Then, the oxide semiconductor layer 11 was formed by sputtering on the substrate 6 on which the second and third electrodes 4 and 5 were formed. The film forming conditions were as follows.

Target: IGZO (an oxide with atomic ratios of: In=33.4 at %, Ga=33.3 at %, Zn=33.3 at %)
Ultimate vacuum: $8.2 \times 10^{-4}$ Pa
Degree of vacuum for sputtering: $1.9 \times 10^{-1}$ Pa
Sputtering gas: Ar 10 sccm, $O_2$ 1 sccm Sputtering output: 50 W The substrate was not heated. After exposure to the air, the oxide semiconductor layer 11 was subjected to an UV/ozone treatment for 15 minutes. Thereafter, a film of pentacene was formed on the top of the oxide semiconductor layer 11 by vacuum vapor deposition.

The semiconductor device thus produced has the following configuration.

Si/SiO$_2$ film: 300 nm (substrate 6 (first electrode 2) and insulating layer)
Cr film: 1 nm, Au film: 40 nm (second and third electrodes 4 and 5)
IGZO film (amorphous): 50 nm (oxide semiconductor layer 11)
Pentacene film: 50 nm (organic semiconductor layer 10)
Channel length L: 100 μm
Channel width W: 2 mm Subsequently, the semiconductor device was allowed to operate as a TFT. In the semiconductor device in this case, the first electrode 2 was used as the gate electrode, the second electrode 4 was used as the source electrode, and the third electrode 5 was used as the drain electrode. The characteristics of the semiconductor device are shown in FIG. 9(a) and FIG. 10(a).

Figure 9A:
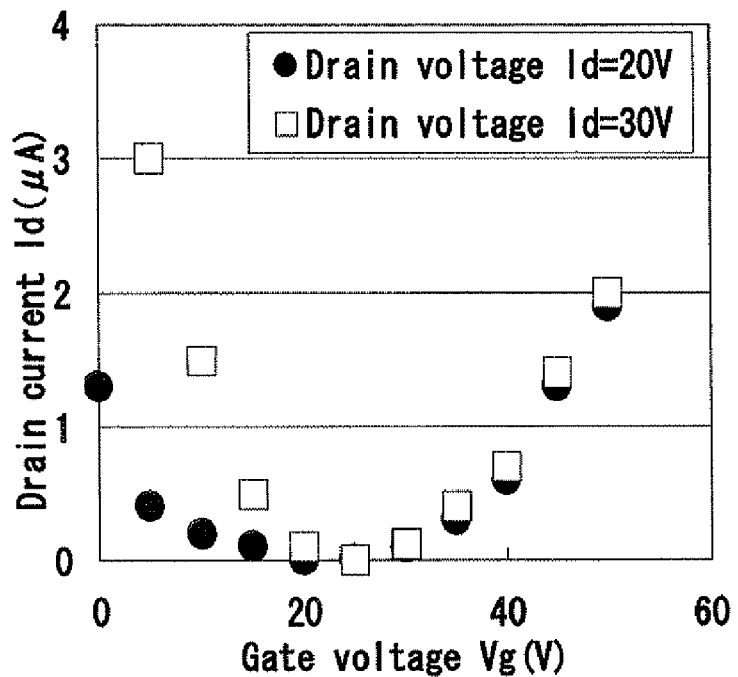
FIG. 9A is a graph showing the characteristics of the semiconductor device according to Example 1 of the invention.
Figure 10A:
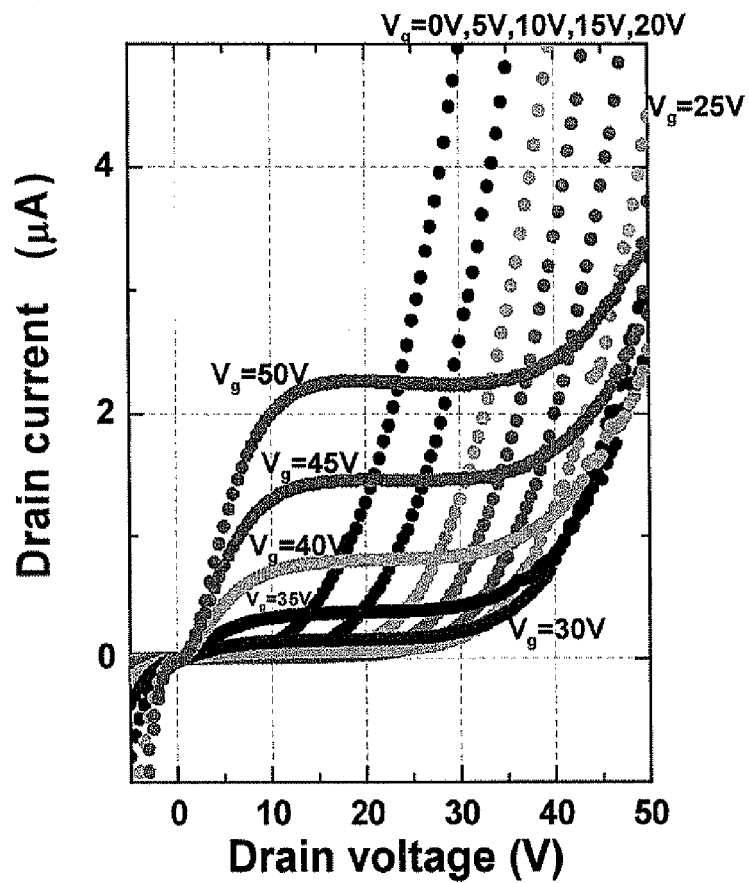
FIG. 10A is a graph showing the characteristics of the semiconductor device according to Example 1.

As shown in FIG. 9(a), when the drain voltages were 20 V and 30 V, a region where the drain current increased with an increase in gate voltage and a region where the drain current increased with a decrease in the gate voltage exist, which means the semiconductor device exhibited ambipolar characteristics. The field effect mobility at the time of n-type driving was 0.06 cm$^2$/Vs, and the field effect mobility at the time of p-type driving was 0.6 cm$^2$/Vs.

Example 2

As shown in FIG. 3, the semiconductor device of this example was produced by the following method.

A conductive silicon substrate was used as the substrate 6. The substrate 6 was subjected to thermal oxidation to form the insulating layer 3.

Then, the oxide semiconductor layer 11 was formed by using a sputtering apparatus. The film forming conditions were as follows.

Target: In$_2$O$_3$—ZnO (an oxide with atomic ratios of: In=93 at %, Zn=7 at %)
Ultimate vacuum: 8.2×10$^{-4}$ Pa
Degree of vacuum for sputtering: 1.9×10$^{-1}$ Pa
Sputtering gas: Ar 10 sccm, O$_2$ 1 sccm
Sputtering output: 50 W The substrate was not heated during film formation. After sputtering, the film was heat-treated in the air at 300° C. for one hour.

The oxide semiconductor layer 11 was then subjected to an UV/ozone treatment for 15 minutes. Thereafter, a film of pentacene was formed on the top of the oxide semiconductor layer 11 by vacuum vapor deposition.

On the organic semiconductor layer 10, a film of Cr and a film of Au were formed by vacuum vapor deposition using a shadow mask, thereby forming the second and third electrodes 4 and 5.

The semiconductor device thus produced has the following configuration.

Si/SiO$_2$ film: 300 nm (substrate 6 (first electrode 2) and insulating layer)
In$_2$O$_3$—ZnO film (polycrystalline film): 30 nm (oxide semiconductor layer 11)
Pentacene film: 50 nm (organic semiconductor layer 10)
Cr film: 1 nm, Au film: 40 nm (second and third electrodes 4 and 5)
Channel length L: 100 μm
Channel width W: 2 mm The semiconductor device exhibited ambipolar characteristics, as in Example 1. The field effect mobility at the time of n-type driving was 5.2 cm$^2$/Vs, and the field effect mobility at the time of p-type driving was 0.6 cm$^2$/Vs.

Example 3

Figure 11A:
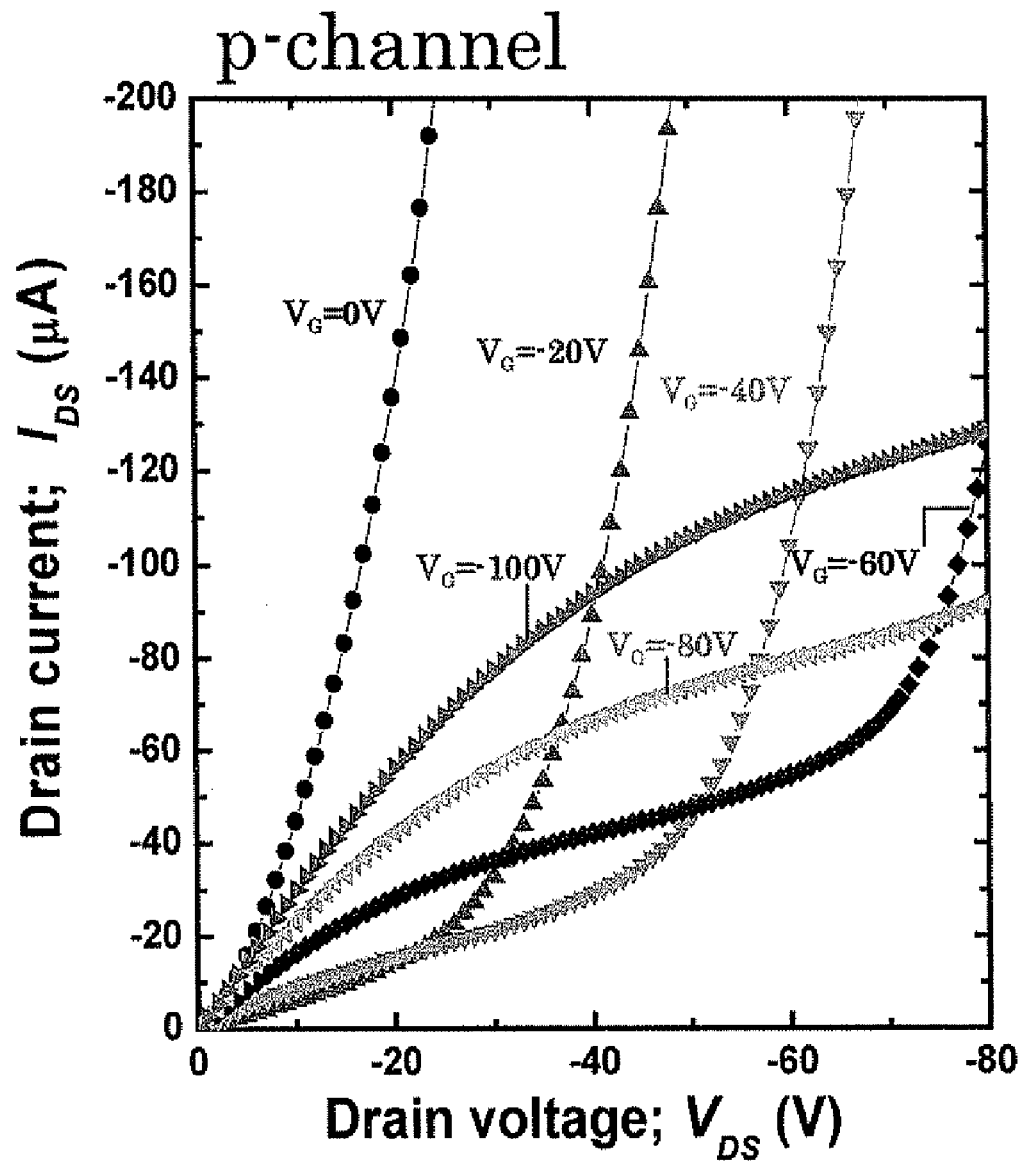
FIG. 11A is a graph showing drain voltage-drain current characteristics at the time of p-type driving of the semiconductor device according to Example 3 of the invention.
Figure 11B:
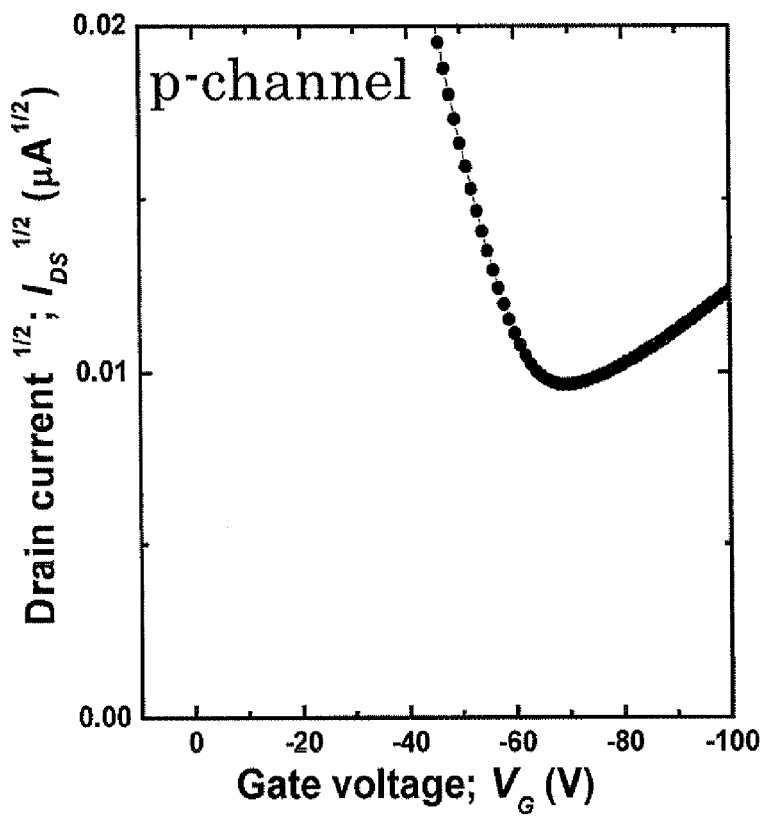
FIG. 11B is a graph showing gate voltage-drain current characteristics at the time of p-type driving of the semiconductor device according to Example 3 of the invention.
Figure 11C:
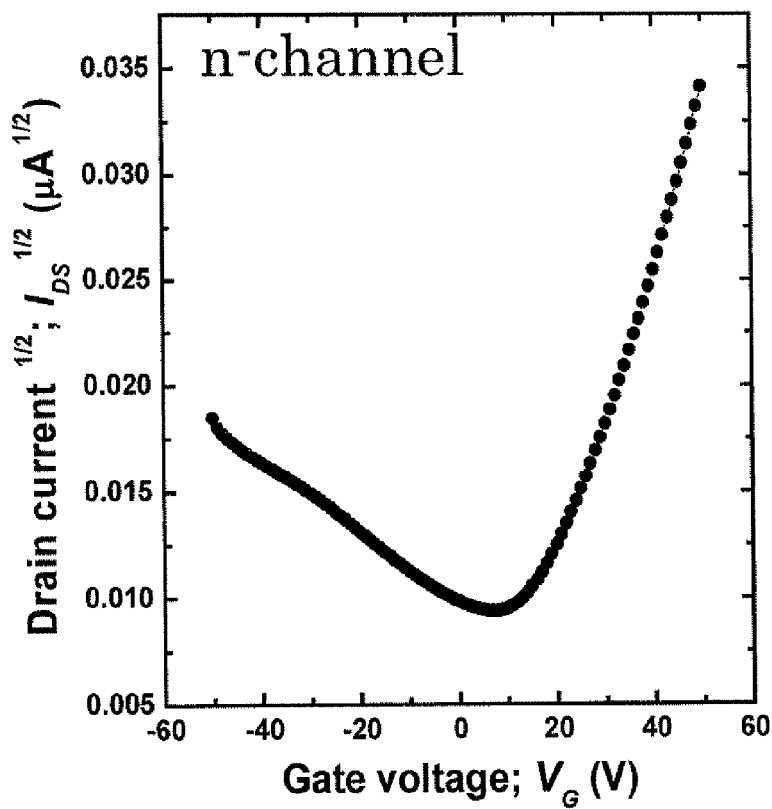
FIG. 11C is a graph showing gate voltage-drain current characteristics at the time of n-type driving of the semiconductor device according to Example 3 of the invention.

The semiconductor device was fabricated in the same manner as in Example 2, except that the film thickness of the In$_2$O$_3$—ZnO film (polycrystalline film) was changed to 15 nm (oxide semiconductor layer 11). As a result, the semiconductor device exhibited ambipolar characteristic as shown in FIGS. 11(a) to (c).

The semiconductor device exhibited ambipolar characteristics, as in Example 1. The field effect mobility at the time of n-type driving was 6.7 cm$^2$/Vs, and the field effect mobility at the time of p-type driving was 0.11 cm$^2$/Vs.

Example 4

Figure 12A:
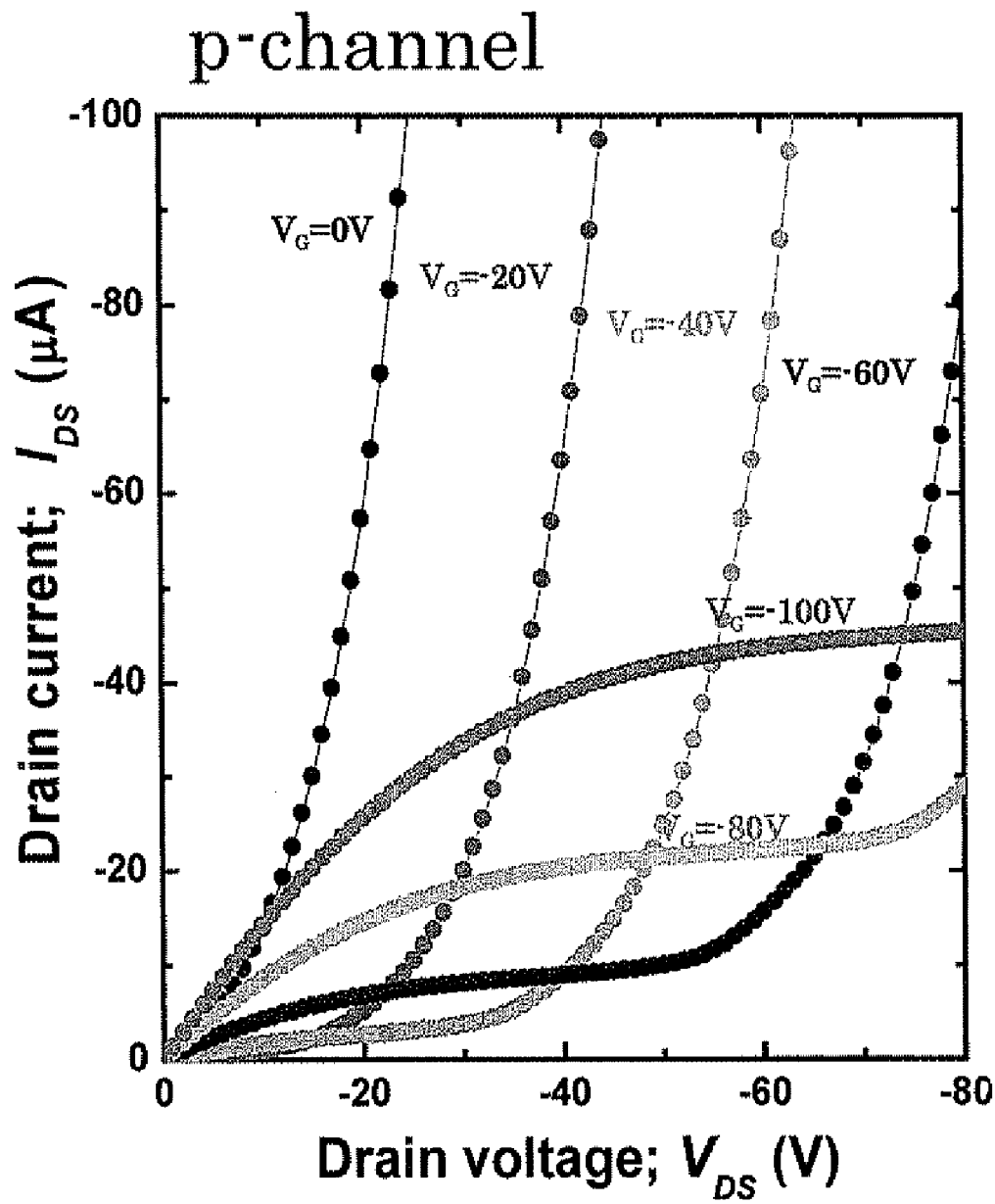
FIG. 12A is a graph showing drain voltage-drain current characteristics at the time of p-type driving of the semiconductor device according to Example 4 of the invention.
Figure 12B:
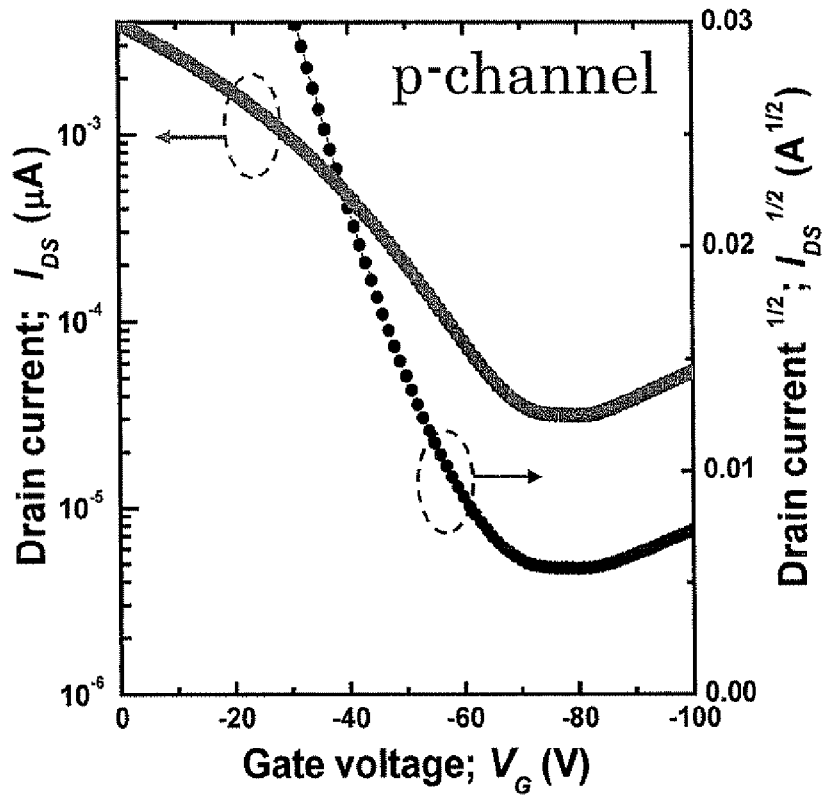
FIG. 12B is a graph showing gate voltage-drain current characteristics at the time of p-type driving of the semiconductor device according to Example 4 of the invention.
Figure 12C:
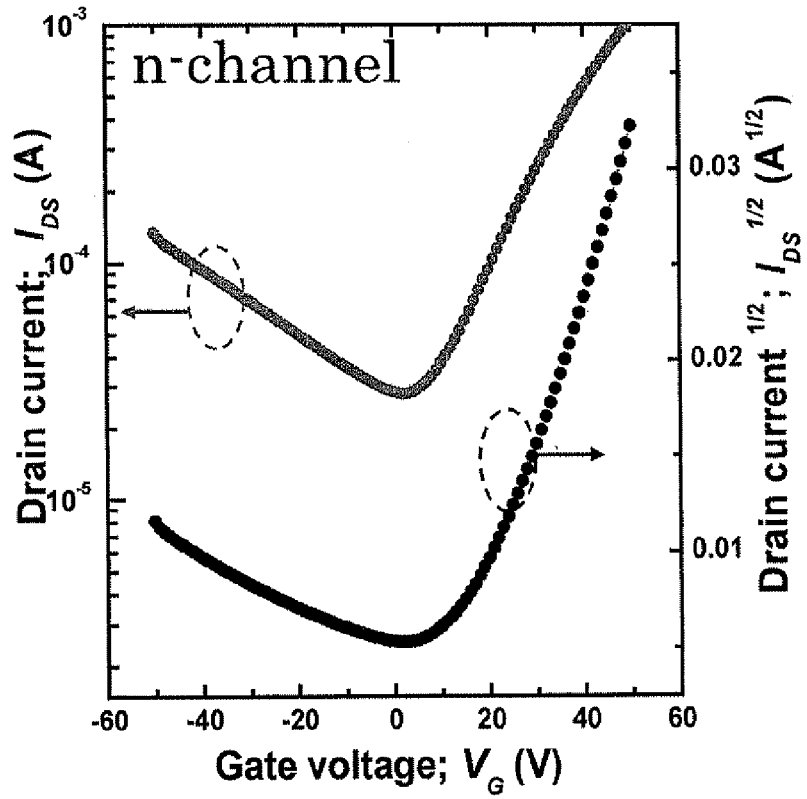
FIG. 12C is a graph showing gate voltage-drain current characteristics at the time of n-type driving of the semiconductor device according to Example 4 of the invention.

The semiconductor device was fabricated in the same manner as in Example 2, except that the thickness of the In$_2$O$_3$—ZnO film (polycrystalline film) was changed to 15 nm (oxide semiconductor layer 11) and the channel length L was changed to 200 μm. As a result, the semiconductor device exhibited ambipolar characteristic as shown in FIGS. 12(a) to (c).

Figure 13:
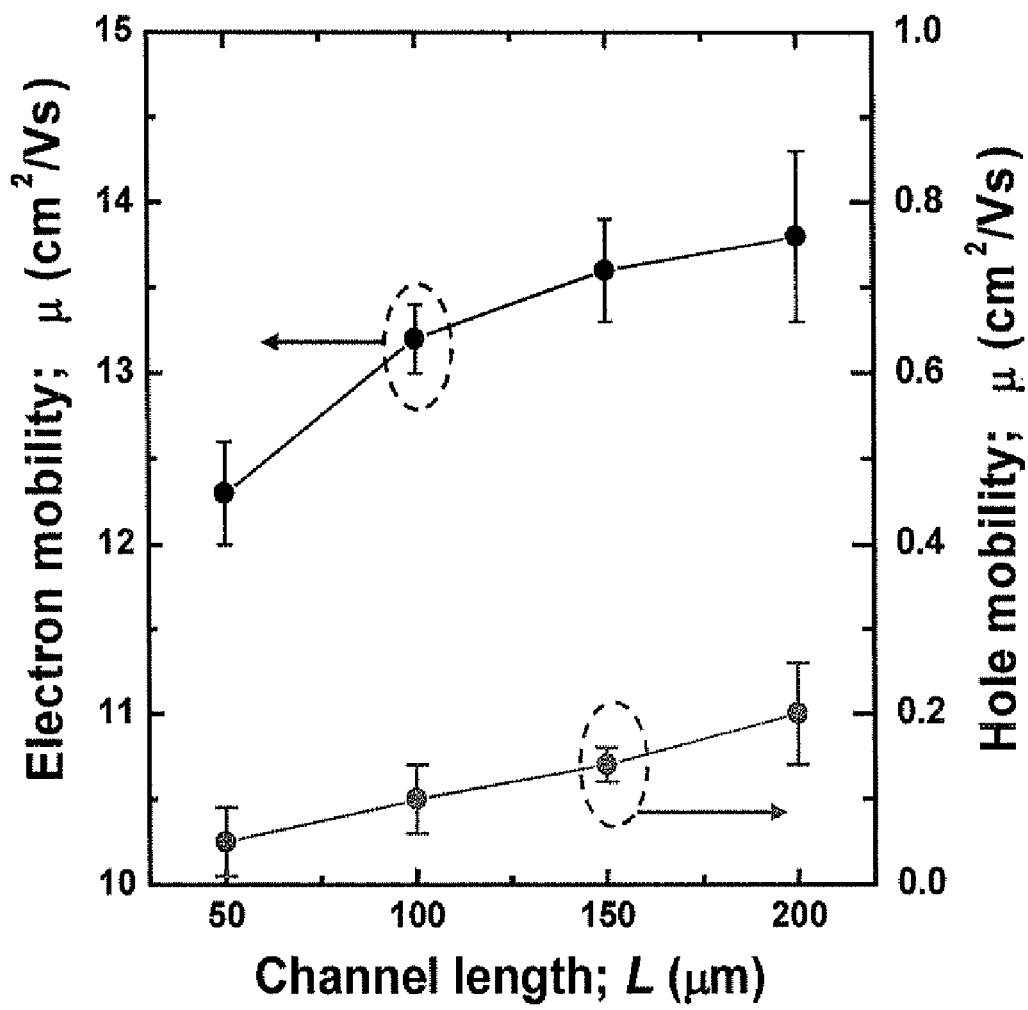
FIG. 13 is a graph showing the characteristics of the semiconductor device according to Example 4 of the invention, and demonstrating the change in characteristics when varying the channel length L.

FIG. 13 shows how the characteristics of the semiconductor device in Example 4 varied with a change in channel length L.

The field effect mobility at the time of n-type driving was 13.8 cm$^2$/Vs with a channel length L of 200 μm, and 12.3 cm$^2$/Vs with a channel length L of 50 μm.

The field effect mobility at the time of p-type driving was 0.2 cm$^2$/Vs with a channel length L of 200 μm, and 0.05 cm$^2$/Vs with a channel length L of 50 μm.

Comparative Example 1

Figure 8:
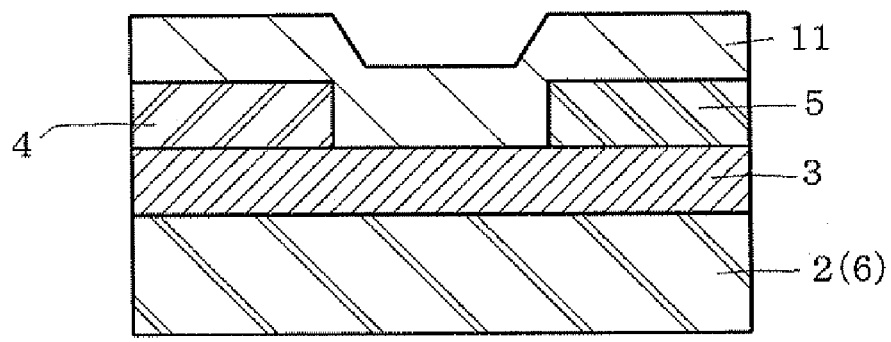
FIG. 8 is a view showing a semiconductor device according to a comparative example.

For comparative purposes, a semiconductor device which was substantially similar to the semiconductor device in Example 1 except for the absence of the organic semiconductor layer 10 was fabricated (FIG. 8).

The semiconductor device thus formed showed only n-type characteristics, and did not exhibit ambipolar characteristics.

Figure 9B:
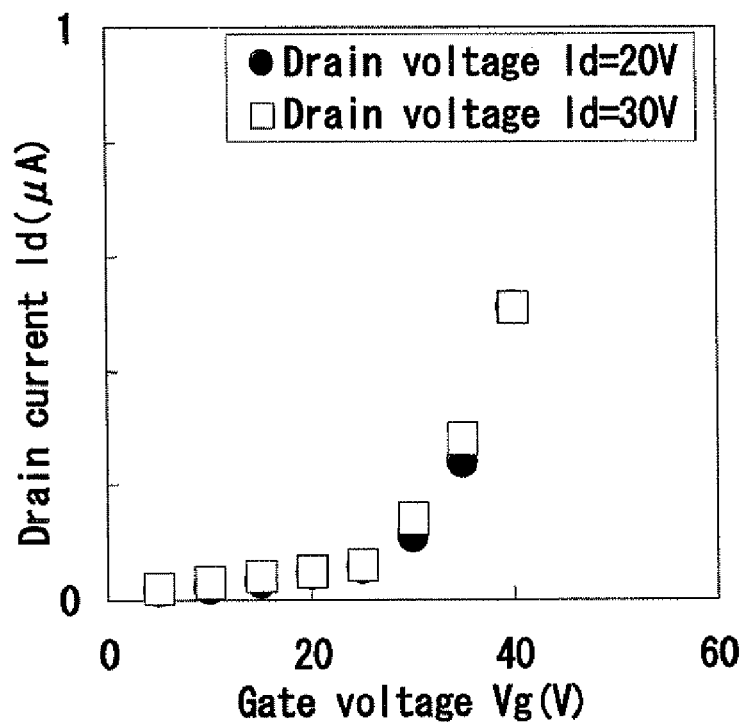
FIG. 9B is a view showing the characteristics of the semiconductor device according to Comparative Example 1.
Figure 10B:
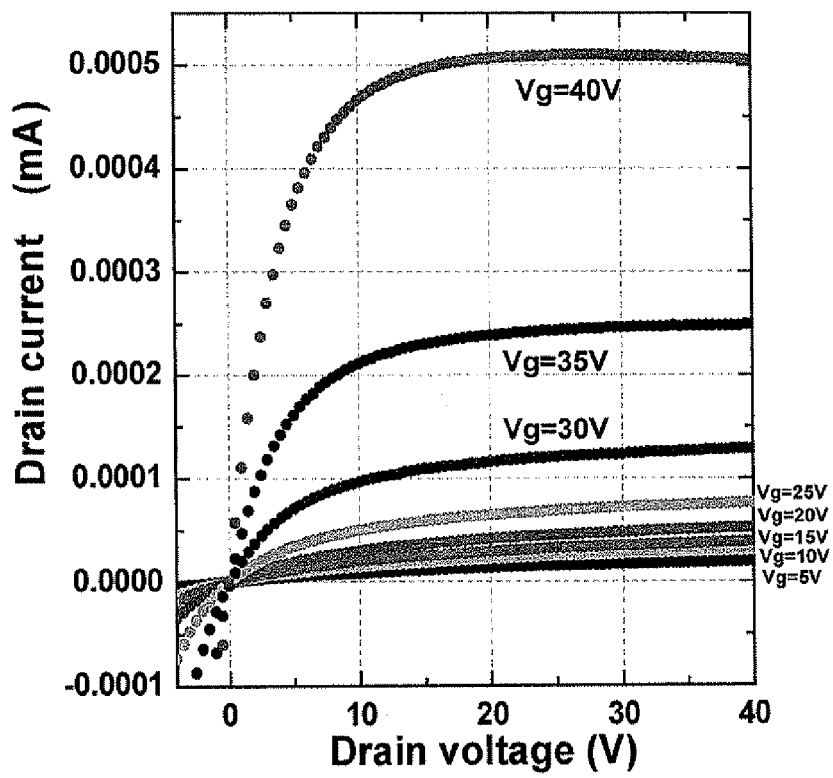
FIG. 10B is a graph showing the characteristics of the semiconductor device according to Comparative Example 1.

The characteristics of this comparative semiconductor device are shown in FIG. 9(b) and FIG. 10(b).

Comparative Example 2

A semiconductor device was fabricated in the same manner as in Example 2, except that a film of perfluoropentacene, an organic substance with n-type characteristics, was formed by vacuum vapor deposition, and the UV/ozone treatment was omitted.

The semiconductor device thus produced has the following configuration.

Si/SiO$_2$ film: 200 nm (substrate 6 (first electrode 2) and insulating layer)
Perfluoropentacene film: 10 nm (oxide semiconductor layer 11)
Pentacene film: 35 nm (organic semiconductor layer 10)
Cr film: 1 nm, Au film: 40 nm (second and third electrodes 4 and 5)
Channel length L (distance between the second electrode 4 and the fifth electrode 5: 75 μm
Channel width W: 1,000 μm The semiconductor device exhibited ambipolar characteristics. The field effect mobility at the time of n-type driving was 0.02 cm$^2$/Vs, and the field effect mobility at the time of p-type driving was 0.5 cm$^2$/Vs.

As in the case of Example 2, mobility significantly lowered by exposure to the air prior to the formation of the pentacene film.

The semiconductor, the semiconductor device, and the complementary transistor circuit device of the invention were explained above with reference to the preferred embodiments. The invention is, however, not limited to the above embodiments, and various modifications can be made within the scope of the invention.

For example, in the semiconductor device in the first to sixth embodiments, the oxide semiconductor layer was formed on the insulating layer, and the organic semiconductor layer was formed on the oxide semiconductor layer. The configuration of the semiconductor device is not limited thereto, and the organic semiconductor layer may be formed on the insulating layer, and the oxide semiconductor layer may be formed on the organic semiconductor layer.

Further, in the third to sixth embodiments, the substrate was used as the first electrode. The configuration is not limited thereto, and the substrate and the first electrode may be provided separately as in the second embodiment. The design may be changed appropriately.

The semiconductor device of the invention was used as a field effect transistor. The application of the semiconductor device of the invention is not limited thereto, and the semiconductor device of the invention may be used as a light-emitting element or a light-receiving element.

Without further elaboration, it is believed that one skilled in the art can, using the preceding description, utilize the present invention to its fullest extent. The preceding preferred specific embodiments are, therefore, to be construed as merely illustrative, and not limitative of the remainder of the disclosure in any way whatsoever.

In the foregoing and in the examples, all temperatures are set forth uncorrected in degrees Celsius and, all parts and percentages are by weight, unless otherwise indicated.

The entire disclosures of all applications, patents and publications, cited herein and of corresponding Japanese application No. 2007-036580, filed Feb. 16, 2007, is incorporated by reference herein.

The preceding examples can be repeated with similar success by substituting the generically or specifically described reactants and/or operating conditions of this invention for those used in the preceding examples.

From the foregoing description and drawings, one skilled in the art can easily ascertain the essential characteristics of this invention and, without departing from the spirit and scope thereof, can make various changes and modifications of the invention to adapt it to various usages and conditions.

What is claimed is:

1. A semiconductor comprising an organic semiconductor layer and an oxide semiconductor layer, wherein at least one of the following conditions a), b), or c) is satisfied:
   a) the oxide semiconductor layer is formed of an amorphous oxide containing at least one of In, Zn, Sn, and Ga;
   b) the oxide semiconductor layer is formed of a polycrystalline oxide containing In and a positive divalent element;
   c) the oxide semiconductor layer has a stacked layer structure in which a plurality of layered oxides are stacked, and a layered oxide closest to the organic semiconductor layer is formed of a material which allows the layered oxide to have a work function larger than the work function of other layered oxides.

2. The semiconductor according to claim 1, wherein the semiconductor is provided with ambipolar (n-type and p-type) characteristics.

3. The semiconductor according to claim 1, wherein the organic semiconductor layer is formed of an organic substance with p-type characteristics, an organic substance with ambipolar characteristics, an organic substance with n-type characteristics, or a stacked body or a mixture body composed of two or more thereof.

4. The semiconductor according to claim 1, wherein the oxide semiconductor layer is formed of a non-degenerated oxide with n-type characteristics.

5. The semiconductor according to claim 4, wherein the oxide semiconductor layer has an electron carrier density of less than 10$^{18}$/cm$^3$.

6. A semiconductor comprising an organic semiconductor layer and an oxide semiconductor layer, wherein the oxide semiconductor layer is formed of an amorphous oxide containing at least one of In, Zn, Sn, and Ga.

7. The semiconductor according to claim 1, wherein the oxide semiconductor layer has a work function of 4.8 (eV) or more.

8. The semiconductor according to claim 1, wherein the oxide semiconductor layer has a band gap of 2.5 (eV) or more.

9. The semiconductor according to claim 1, wherein the organic semiconductor layer and the oxide semiconductor layer are in contact with each other.

10. A semiconductor comprising an organic semiconductor layer and an oxide semiconductor layer, wherein the oxide semiconductor layer is formed of an amorphous oxide containing In, Ga, and Zn, an amorphous oxide containing Sn, Zn, and Ga, an amorphous oxide containing In and Zn, an amorphous oxide containing In and Sn, an amorphous oxide containing In and Ga, or an amorphous oxide containing Zn and Sn.

11. A semiconductor comprising an organic semiconductor layer and an oxide semiconductor layer, wherein the oxide semiconductor layer is formed of a polycrystalline oxide containing In and a positive divalent element.

12. A semiconductor comprising an organic semiconductor layer and an oxide semiconductor layer, wherein the oxide semiconductor layer has a stacked layer structure in which a plurality of layered oxides are stacked, and a layered oxide closest to the organic semiconductor layer is formed of a material which allows the layered oxide to have a work function larger than the work function of other layered oxides.

13. A semiconductor device comprising:
   a semiconductor;
   a first electrode;
   an insulating layer interposed between the semiconductor and the first electrode;
   a second electrode which is in contact with the semiconductor and is detached from the first electrode; and
   a third electrode which is in contact with the semiconductor and is detached from the first electrode and the second electrode;
   the semiconductor being formed of the semiconductor according to claim 1.

14. The semiconductor device according to claim 13, wherein the organic semiconductor layer and the oxide semiconductor layer are formed into a thin film.

15. The semiconductor device according to claim 13, wherein a ratio ($\mu(n)/\mu(p)$) of a field effect mobility ($\mu(n)$) at the time of n-type driving and a field effect mobility ($\mu(p)$) at the time of p-type driving is $10^{-5} \leq \mu(n)/\mu(p) \leq 10^5$.

16. A complementary transistor circuit device provided with a plurality of semiconductor devices, wherein at least one of the plurality of semiconductor devices is formed of the semiconductor device according to claim 13.

* * * * *